United States Patent [19]
Hareyama et al.

[11] Patent Number: 5,752,169
[45] Date of Patent: May 12, 1998

[54] INTEGRATED CIRCUIT AND TRANSMITTER/RECEIVER

[75] Inventors: Nobuo Hareyama; Hiroshi Yokoyama, both of Kanagawa, Japan

[73] Assignee: Sony Corporation, Tokyo, Japan

[21] Appl. No.: 613,510

[22] Filed: Mar. 11, 1996

[30]     Foreign Application Priority Data

Mar. 14, 1995 [JP] Japan .................................. 7-081674

[51] Int. Cl.⁶ ........................................................ H04B 1/50
[52] U.S. Cl. ............................ 455/76; 455/260; 455/553; 375/219; 375/328
[58] Field of Search .................................. 455/75, 76, 77, 455/83, 84, 85, 86, 112, 260, 265, 333, 552, 553; 375/274, 219, 328

[56]           References Cited

U.S. PATENT DOCUMENTS 4,823,373  4/1989  Takahashi et al. .................... 455/553
5,021,754  6/1991  Shepherd et al. ...................... 332/128
5,515,364  5/1996  Fague ..................................... 370/29

FOREIGN PATENT DOCUMENTS 2267401  12/1993  United Kingdom ............... H03L 7/18

Primary Examiner—Reinhard J. Eisenzopf
Assistant Examiner—Lee Nguyen
Attorney, Agent, or Firm—Jay H. Maioli

[57]                  ABSTRACT

An integrated circuit comprises a variable frequency divider for setting a signal transmitting frequency in accordance with a frequency dividing ratio based on externally-provided data. A data converter converts the externally-provided data to a signal for transmission, and a switch selectively provides the externally-provided data to the variable frequency divider and the data converter. As a result, the number of terminals may be reduced, the IC package may be made more compact, the mounting surface area may be reduced, the equipment may be made smaller, and the interference of the data signal provided to the circuit for setting the frequency dividing ratio or the circuit for transmitting data is reduced.

4 Claims, 5 Drawing Sheets

| channel number CHNO | base unit transmission frequency (MHz) | portable unit transmission frequency (MHz) |
|---|---|---|
| 1 | 380.2125 | 253.8625 |
| 2 | 380.2250 | 253.8750 |
| 3 | 380.2375 | 253.8875 |
| ... | ... | ... |
| 89 | 381.3125 | 254.9625 |

CMND command signal

INTEGRATED CIRCUIT AND TRANSMITTER/RECEIVER

BACKGROUND OF THE INVENTION

The present invention relates to an integrated circuit and a transmitter/receiver employing the integrated circuit.

In Japan, for example, 89 channel frequency bands are allotted to low-power cordless telephones. The relationship between the channel numbers CHNO and transmission frequencies of the base unit and portable unit is as shown in FIG. 1. The frequency intervals between channels in this case are all fixed at 12.5 kHz.

Such frequency transmission signals are generally formed using phase-locked loops (hereinafter referred to as "PLL's"). However, in the case of setting-up channels for base units or portable units, frequency dividing ratio data corresponding to the channel number CHNO may also be formed using a microcomputer, and this data may be set in a PLL variable frequency dividing circuit.

With cordless telephones, in the case of, for example, a request from the portable unit to the base unit for a connection between both parties for calling out, or a request from the base unit to the portable unit for a connection between both parties due to an incoming call, command signals representing these requests and parameters are transmitted and received between the base unit and the portable unit.

FIG. 2 shows an example of a format for this command signal CMND. This signal CMND begins with a bit synchronization signal BSYN of 16 bits, followed by a frame synchronization signal FSYN of 16 bits. The synchronization signals BSYN and FSYN both have prescribed bit patterns, but the bit patterns are made to be different from each other for the frame synchronization signal FSYN transmitted from the portable unit to the base unit and for the frame synchronization signal PSYN transmitted from the base unit to the portable unit.

Further, the command signal CMND has a 25 bit system identification ("identification" being hereinafter referred to as "ID") code SYID, a 12 bit error correction code ECC for this code SYID, and a 5 byte control code CTRL after the signal FSYN. In this case, the system ID code SYID is data provided for distinguishing the unit itself from other units. Moreover, the control code CTRL has the first byte for a code displaying the control items for the portable unit and the base unit and the second to fifth bytes for parameters and data relating to the first byte.

When the portable unit or base unit then receives this command signal CMND, the ID code SYID included in this command signal CMND is checked for coincidence with the ID code SYID stored in the unit itself. When the ID codes SYID coincide, the command signal CMND is then made only effective and is made ineffective when there is no coincidence.

This command signal CMND is converted to an MSK signal (transformed MSK signal) while being transmitted between the base unit and the portable unit. This MSK signal is, for example, a one cycle sine wave signal of frequency 2.4 kHz when the bit of the command signal CMND is "0", and is a half-cycle sine wave signal of frequency 1.2 kHz when the bit of the command signal CMND is "1".

Here, the frequency dividing ratio data described above, which is formed using a microcomputer, is provided to a PLL variable dividing circuit by often adopting 3-wire system serial transmissions (serial communications) for usefulness and simplicity. This is to say that the frequency dividing ratio data is transmitted serially using a serial clock and a chip enable signal (data latch signal).

Further, in the case where the command signal CMND is converted to an MSK signal, the command signal CMND may be also formed at a microcomputer, serially transmitted to a conversion circuit and then converted to an MSK signal.

Therefore, in order to provide the PLL circuit and the MSK signal converter circuit on a single integrated circuit (hereinafter referred to as "IC"), the input circuit for this IC may be provided as;

(1) respective input circuits for the PLL and the MSK signal converter circuit, and (2) an input circuit for a serial signal line adopting a pipeline processing.

However, in the input circuits in (1), the number of signal lines increases, as does the number of IC terminal pins, which is disadvantageous with regards to circuit integration.

Further, with the input circuit in (2), the number of IC terminal pins may be reduced, but the data communications (data transmissions) with data being inputted to one circuit induce noise in other circuits.

The present invention therefore sets out to resolve the aforementioned problems.

SUMMARY OF THE INVENTION

In order to resolve these problems, according to the present invention, there is provided an integrated circuit which comprises a variable frequency divider for setting a signal transmitting frequency in accordance with a frequency dividing ratio based on externally-provided data, a data converter for converting the externally-provided data to a signal for transmission and a switch for selectively providing the externally-provided data to the variable frequency divider and the data converter.

The variable frequency divider may comprise a phase-locked loop, and the switch may be switched in accordance with an externally provided control signal.

Further, according to the present invention, there is provided a transmitter/receiver which comprises an integrated circuit having a variable frequency divider for setting a signal transmitting frequency in accordance with a frequency dividing ratio based on externally-provided data, a data converter for converting the externally-provided data to a signal for transmission and a switch for selectively providing the externally-provided data to the variable frequency divider and the data converter.

The variable frequency divider may comprise a phase-locked loop, with the phase-locked loop deciding a transmitting frequency and a receiving frequency.

The switch may be switched in accordance with the externally provided control signal and is also controlled in accordance with the externally-provided control signal to selectively carry out setting-up of the transmitting frequency and the receiving frequency, and transmitting of the externally-provided data.

Data is then selectively provided to the PLL variable frequency dividing circuit and the conversion circuit.

DETAILED DESCRIPTION OF THE PREFERRED EMBODIMENT

With cordless telephones, the command signal CMND is formed when requests and data are accessed between the portable unit and the base unit, with an MSK signal for the command signal CMND being transmitted and received.

A command signal CMND is therefore not formed or may not have to be formed when a channel is not determined between the portable unit and the base unit. Further, it is not theoretically possible to transmit or receive a command signal CMND while switching over channels between the portable unit and the base unit.

This is to say that the forming or transmitting and receiving of the command signal CMND, and the channel switching, do not overlap with each other with respect to time.

In taking notice of the above points, the present invention aims to enable the data for the frequency dividing ratio of a PLL variable frequency dividing circuit and data for the command signal CMND to be inputted to an IC using a small number of terminals.

Example of a Cordless Telephone

Figures 1, 2:
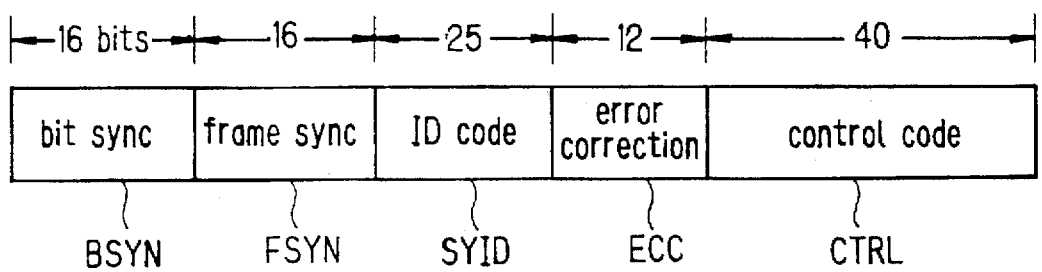
FIG. 1 shows an example of the relationship between the channel numbers and transmission frequencies in a cordless telephone.
FIG. 2 shows an example of a format of the command signal CMND.
Figure 3:
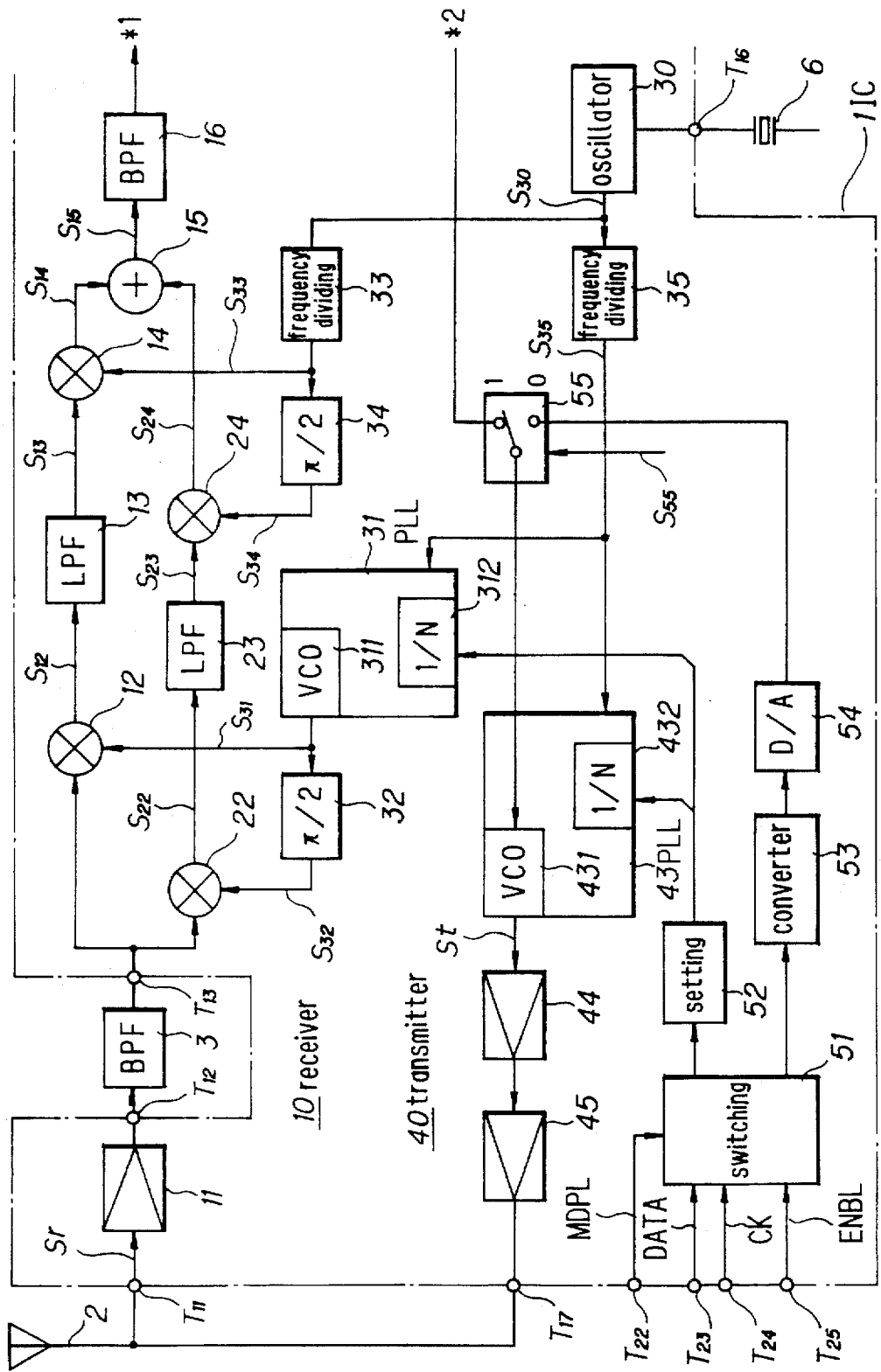
FIG. 3 is a system diagram showing a part of an example of the circuit according to present invention.
Figure 4:
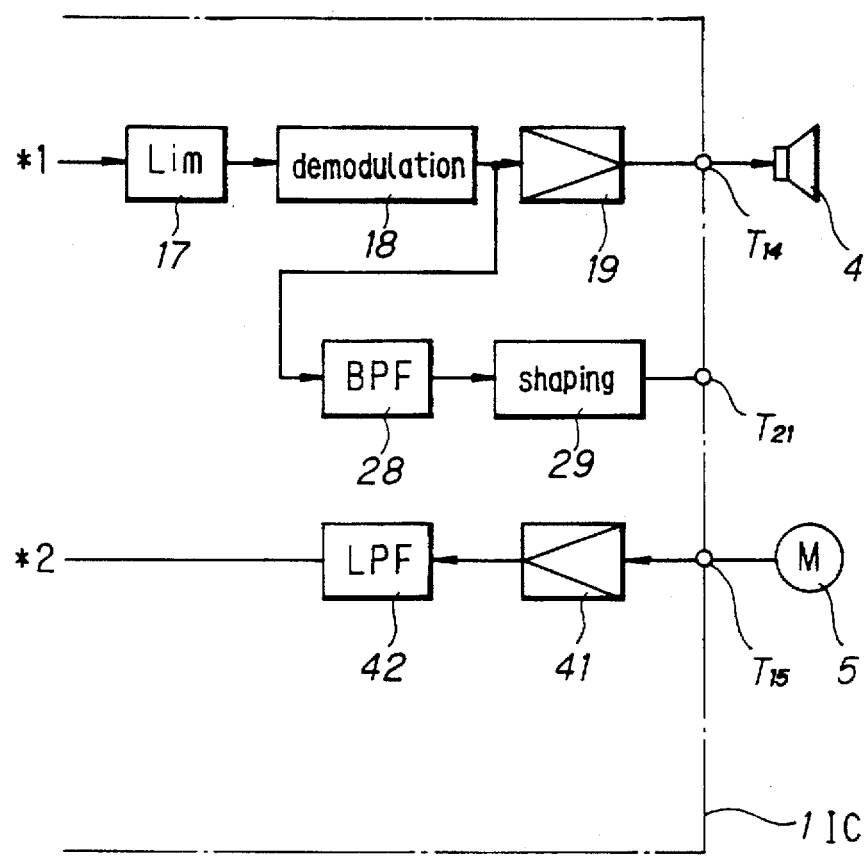
FIG. 4 is a system diagram showing a continuation of the example of the circuit of FIG. 1.

First, an example of a receiving circuit and transmitting circuit for a cordless telephone of the present invention will be described with reference to FIG. 3 and FIG. 4. In this example, the whole of the receiving circuit and transmitting circuit are made to be capable of being formed on a single IC, which is shown in the figures as being used in a portable unit. Here, lines denoted by *1 and *2 in FIG. 3 and *1 and *2 in FIG. 4 are connected to each other to form the full configuration of the circuit and the portion 1 surrounded by the dotted-and-dashed line is formed into a single IC.

The IC 1 has a receiving circuit 10 and a transmitting circuit 40. The receiving circuit 10 has a direct conversion-type structure employing a double super-heterodyne receiving circuit. That is, a down channel FM signal Sr from the base unit is received by the antenna 2 and then provided from a terminal T11 to a high frequency amplifier 11, on to a terminal T12, then to a band-pass filter 3 that allows all bands of the down channels to pass and then finally via the signal line of terminal T13 on to first mixer circuits 12 and 22 for performing an orthogonal transformation to an I axis and a Q axis.

Further, an oscillating circuit 30 is provided for forming an oscillated signal S30 with a stable reference frequency of, for example, 14.4 MHz. To attain this, a crystal oscillator 6 is connected via the terminal T16 so as to make the oscillating circuit 30 as a crystal oscillating circuit.

This oscillated signal S30 is then provided to a frequency dividing circuit 35 which divides an input frequency into 1/1152, thereby a signal S35 being produced with a frequency of 12.5 kHz corresponding to the channel spacing frequency. This signal S35 is then provided to a PLL circuit 31 as the reference frequency signal.

Moreover, an oscillated signal S31 with a frequency equal to the carrier frequency of the FM signal Sr is generated from the VCO 311 of the PLL circuit 31, with this being described in detail later. In this case, the frequency of the oscillated signal S31 is equal to the transmission frequency of the base unit because the carrier frequency of the received FM signal Sr is equal to the transmission frequency of the base unit.

The signal S31 is provided to the first mixer circuit 12 as a first locally oscillated signal. The signal S31 is also provided to a frequency-shifting circuit 32 where the signal S31 is phase-shifted by just $\pi/2$. The phase-shifted signal S32 is then provided to the first mixer circuit 22 as the first locally oscillated signal.

Figure 5A:
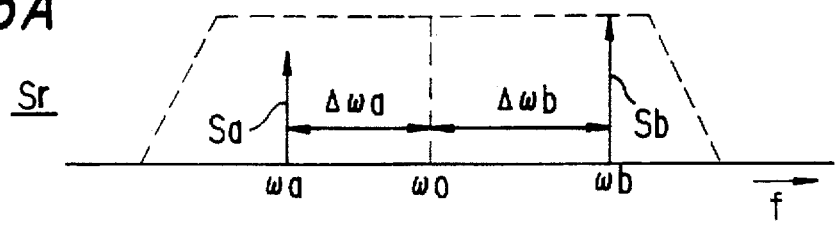
FIG. 5A and FIG. 5B are frequency spectrum diagrams explaining the present invention.

Therefore, as simply shown in FIG. 5A, the received signal Sr has a signal component Sa within the lower sideband and a signal component Sb within the upper sideband. Further, if we let $\omega o$: the carrier frequency (angular frequency) of the received signal Sr $\omega a$: angular frequency of signal component Sa.

$$\omega a < \omega o$$

Ea: amplitude of signal component Sa
$\omega b$: angular frequency of signal component Sb.

$$\omega b > \omega o$$

Eb: amplitude of signal component Sb $$\Delta \omega a = \omega o - \omega a$$

$$\Delta \omega b = \omega b - \omega o,$$

then, $$Sr = Sa + Sb$$

$$Sa = Ea \cdot \sin \omega at$$

$$Sb = Eb \cdot \sin \omega bt.$$

Further, if we let
E1: the amplitude of the first locally oscillated signals S31 and S32,
then, $$S31 = E1 \cdot \sin \omega ot$$

$$S32 = E1 \cdot \cos \omega ot.$$

Therefore, if we let
S12, S22: output signals of the first mixer circuits 12 and 22,
then, $S12 = Sr \cdot S31 =$ $(Ea \cdot \sin\omega at + Eb \cdot \sin\omega bt) \times E1 \cdot \sin\omega ot =$
$\alpha a\{-\cos(\omega a + \omega o)t + \cos(\omega o - \omega a)t\} +$
$\alpha b\{-\cos(\omega b + \omega o)t + \cos(\omega b - \omega o)t\} =$
$\alpha a\{-\cos(\omega a + \omega o)t + \cos\Delta\omega at\} +$ $\alpha b\{-\cos(\omega b + \omega o)t + \cos\Delta\omega bt\}$ $S22 = Sr \cdot S32 =$ $(Ea \cdot \sin\omega at + Eb \cdot \sin\omega bt) \times E1 \cdot \cos\omega ot =$
$\alpha a\{\sin(\omega a + \omega o)t - \sin(\omega o - \omega a)t\} +$
$\alpha b\{\sin(\omega b + \omega o)t + \sin(\omega b - \omega o)t\} =$
$\alpha a\{\sin(\omega a + \omega o)t - \sin\Delta\omega at\} +$ $\alpha b\{\sin(\omega b + \omega o)t + \sin\Delta\omega bt\}$ $\alpha a = Ea \cdot E1/2$ $\alpha b = Eb \cdot E1/2.$ The signals S12 and S22 are provided to the low-pass filters 13 and 23, since the signal components with the angular frequencies $\Delta\omega a$ and $\Delta\omega b$ are necessary for intermediate frequency (hereinafter referred to as IF) signals. The signal components with the angular frequencies $\Delta\omega a$ and $\Delta\omega b$ are provided as the first IF signals S13 and S23 from the low-pass filter 13. The first IF signals are expressed as follows:

$S13 = \alpha a \cdot \cos\Delta\omega at + \alpha b \cdot \cos\Delta\omega bt$ $S23 = -\alpha a \cdot \sin\Delta\omega at + \alpha b \cdot \sin\Delta\omega bt.$ In this case, as being apparent from the above equations and FIG. 5A, the first IF signals S13 and S23 are baseband signals.

These signals S13 and S23 are provided to the second mixer circuits 14 and 24 for I axis and Q axis of orthogonal transformation.

The oscillated signal S30 from the oscillating circuit 30 is provided to the frequency dividing circuit 33 and divided into a relatively low frequency signal S33. For example, the signal S33 is divided by 262 to a frequency of about 55 kHz. This signal S33 is provided to the second mixer circuit 14 as the second locally oscillated signal and provided to the phase-shifted circuit 34 and phase-shifted by $\pi/2$. The phase-shifted signal S34 is provided to the mixer 24 as the second locally oscillated signal.

Therefore, if we let $S33 = E2 \cdot \sin\omega st$ $S34 = E2 \cdot \cos\omega st,$ where
E2: amplitude of second locally oscillated signals S33 and S34

$\omega s = 2\pi fs$ (fs=approximately 55 kHz)
and if we let:
S14, S24: output signals for the mixers 14 and 24, then, $S14 = S13 \cdot S33 =$ $(\alpha a \cdot \cos\Delta\omega at + \alpha b \cdot \cos\Delta\omega bt) \times E2 \cdot \sin\omega st =$
$\beta a\{\sin(\Delta\omega b + \omega s)t - \sin(\Delta\omega a - \omega s)t\} +$ $\beta b\{\sin(\Delta\omega b + \omega s)t - \sin(\Delta\omega b - \omega s)t\}$ $S24 = S23 \cdot S34 =$ $(-\alpha a \cdot \sin\Delta\omega at + \alpha b \cdot \sin\Delta\omega bt) \times E2 \cdot \cos\omega st =$
$-\beta a\{\sin(\Delta\omega a + \omega s)t + \sin(\Delta\omega a - \omega s)t\} +$ $\beta b\{\sin(\Delta\omega b + \omega s)t + \sin(\Delta\omega b - \omega s)t\},$ where $\beta a = \alpha a \cdot E2/2$ $\beta b = \alpha b \cdot E2/2.$ The equations for signals S14 and S24 are transformed so that the value for the frequency difference does not become negative, $S14 = \beta a\{\sin(\Delta\omega a + \omega s)t + \sin(\omega s - \Delta\omega a)t\} +$ $\beta b\{\sin(\Delta\omega b + \omega s)t + \sin(\omega s - \Delta\omega b)t\} =$
$\beta a \cdot \sin(\omega s + \Delta\omega a)t + \beta a \cdot \sin(\omega s - \Delta\omega a)t +$ $\beta b \cdot \sin(\omega s + \Delta\omega b)t + \beta b \cdot \sin(\omega s - \Delta\omega b)t$ $S24 = -\beta a\{\sin(\Delta\omega a + \omega s)t - \sin(\omega s - \Delta\omega a)t\} +$ $\beta b\{\sin(\Delta\omega b + \omega s)t - \sin(\omega s - \Delta\omega b)t\} =$
$-\beta a \cdot \sin(\omega s + \Delta\omega a)t + \beta a \cdot \sin(\omega s - \Delta\omega a)t +$ $\beta b \cdot \sin(\omega s + \Delta\omega b)t - \beta b \cdot \sin(\omega s - \Delta\omega b)t.$ The signals S14 and S24 are then provided to an adding circuit 15 and added to each other. The resultant added signal expressed by the following equation is provided from the adding circuit 15.

Figure 5B:
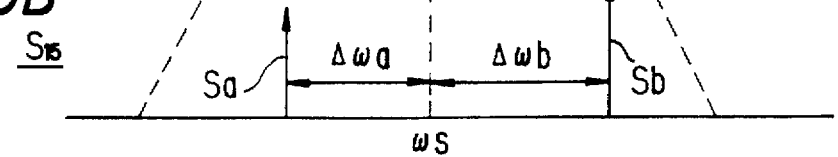

$S15 = S14 + S24 = 2\beta a \cdot \sin(\omega s - \Delta\omega a)t + 2\beta b \cdot \sin(\omega s + \Delta\omega b)t.$ The added signal S15 has signal components as shown in FIG. 5B. This signal S15 is the signal produced from the received signal Sr by replacing the carrier frequency $\omega o$ (angular frequency) with $\omega s$ in frequency conversion. That is, the signal S15 is the second IF signal with the intermediate frequency fs.

Here, the second IF signal S15 is provided to an FM demodulation circuit 18 via a band-pass filter 16 as an IF filter and a limiter amplifier 17 before being demodulated to the original audio signal. This audio signal is then provided to a speaker 4 for the telephone receiver via an amplifier 19 and a terminal T14.

The above description is for the configuration and operation with regards to the audio signal in the receiving circuit 10.

On the other hand, the transmitting circuit 40 processes an audio signal directly as an up channel FM signal. A PLL circuit 43 may therefore be provided and the frequency dividing signal S35 from the frequency dividing circuit 35 is provided as a reference frequency signal to the PLL circuit 43. Thus, a signal St with a carrier frequency for the up channel, which is paired with the down channel received at the receiving circuit 10, is provided from VCO 431 of the PLL circuit 43.

Further, the audio signal from the microphone 5 of the telephone is provided to a low-pass filter 42 via terminal T15 and amplifier 41 so that unnecessary band components are removed, and the audio signal with these unnecessary components being removed is provided to the VCO 431 of the PLL 43 via a switch circuit 55 as the oscillating frequency control signal.

An FM signal St, which is on the upper channel that is paired with the down channel received with the receiving circuit 10 and is FM-modulated by the audio signal from the low-pass filter 42, is thus provided from the VCO 431.

This FM signal St is then taken from terminal T17 via a drive amplifier 44 and an output amplifier 45, provided to the antenna 2, and transmitted to the base unit.

The above description is for the configuration and operation with regards to the audio signal in the transmitting circuit 40.

In the above description, the IC 1 was used for a portable unit. However, if the terminals T14 and T15 are connected to the 4 line/2 line conversion circuit in the base unit, and the frequency dividing ratio of the variable frequency dividing circuits in the PLL circuit 31 is replaced with that in the PLL circuit 43, the above operation in the IC 1 can be carried out in the base unit. In this case, up channel reception is carried out by the receiving circuit 10 and down channel transmission is carried out by the transmitting circuit 40.

This IC 1 is therefore usable in both the base unit and the portable unit.

If the FM receiver is a typical FM receiver, the intermediate frequency is determined to be as high as 10.7 MHz and the intermediate filter should therefore be constructed from ceramic filters which cannot be integrated into an IC.

However, with the aforementioned receiving circuit 10, the first IF signals S12 and S22 are baseband frequency signals and the second intermediate frequency fs is as low as, for example, 55 kHz. The filters 13, 23 and 16 may therefore be constructed from active filters having resistors, capacitors and amplifiers. The receiving circuit 10, with the exception of the filter 3 and the oscillating coil (not shown in the drawings) of the VCO 311, can therefore be formed into an IC. Likewise, the transmitting circuit 40 can be formed into an IC.

The whole receiving circuit 10 and the transmitting circuit 40 can therefore be integrated into a single monolithic IC.

Setting the Frequency Dividing Ratio at the PLL Circuit

PLL circuit 31 and PLL circuit 43 have variable frequency dividing circuits 312 and 423. At the PLL circuit 31, the frequency of the oscillated signal S31 from the VCO 311 is divided by the variable frequency dividing circuit 312, in the same way as in a usual PLL circuit. The phase of this frequency-divided signal is compared with that of the reference signal S35 and by the resulting output of the comparison, the oscillating frequency of the VCO 311 is controlled. The same is for PLL circuit 43.

Therefore, if we let
f31: frequency of signal S31

$$f31 = \omega 0/(2\pi)$$

f43: carrier frequency (center frequency) of signal S43
N31: frequency dividing ratio of variable frequency dividing circuit 312
N43: frequency dividing ratio of variable frequency dividing circuit 432,
then, in a steady state, in the same way as for usual PLL circuits, $$f31 = 12.5[kHz] \times N31$$

$$f43 = 12.5[kHz] \times N43$$

where 12.5[kHz] is the reference frequency of signal S35.

Therefore, if the frequency dividing ratios N31 and N43 are set corresponding to the channel number CHNO of the channel to be used, then transmitting and receiving can be carried out at the channel with this channel number CHNO.

A switching circuit 51 and frequency dividing ratio setting circuit 52 are therefore provided for setting the frequency dividing ratios N31 and N43.

In the current case, for setting the frequency dividing ratios N31 and N43, a data signal DATA for the channel number CHNO, a clock signal CK and an enable signal ENBL are formed in a microcomputer (not shown in the drawings). In this case, as shown, for example, on the left side of FIG. 6, each of the signals DATA and CK is the serial signal and the data signal DATA is formed in synchronization with the clock signal CK. The signal ENBL is a signal that, for example, becomes "0" for the period while the data signal DATA is being provided.

These signals DATA, CK and ENBL, are provided to the switching circuit 51 via terminals T23 to T25.

Because this case is for setting the frequency dividing ratios N31 and N43, a control signal MDPL of, for example, a level "1" is formed at the microcomputer and this signal MDPL is provided to the switching circuit 51 as a control signal thereof via terminal T25.

Thus, in the case of setting the frequency dividing ratios N31 and N43, the signals DATA, CK and ENBL provided to the switching circuit 51 are further provided to the frequency dividing ratio setting circuit 52.

At the frequency dividing ratio setting circuit 52, data for the frequency dividing ratio N31 and N43 corresponding to the selected channel number CHNO is formed from the data signal DATA for the channel number CHNO. The data for the frequency dividing ratio N31 is thus provided to the variable frequency dividing circuit 312 in the PLL circuit 31 and latched. The oscillated signal S31 with a frequency f31 equal to the carrier frequency of the FM signal Sr is then provided from the VCO 311 in the PLL circuit 31.

Data for the frequency dividing ratio N43 formed at the frequency dividing ratio setting circuit 52 is provided to the variable frequency dividing circuit 423 of the PLL circuit 43 and latched. In this way, the FM signal St with carrier frequency f43 for the up channel is provided from VCO 431 of the PLL circuit 43.

Transmitting and Receiving the Command Signal CMND

A converter circuit 53 for converting the command signal CMND to a digital MSK signal and a D/A converter 54 are provided in the IC 1 for transmitting the command signal CMND.

Figure 6:
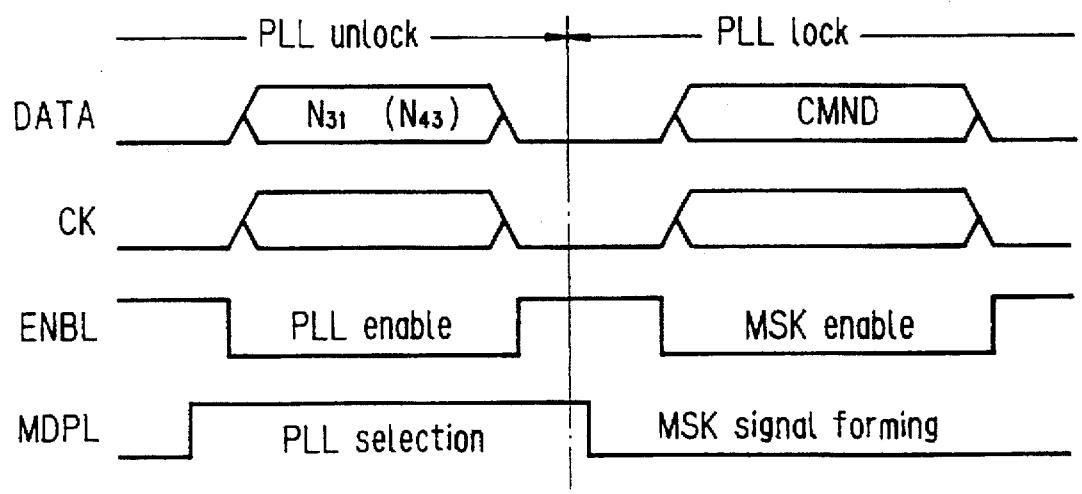
FIG. 6 is a waveform diagram illustrating the operation of the circuit of FIG. 1.

When the command signal CMND is transmitted, the data signal DATA for the command signal CMND, the clock signal CK and the enable signal ENBL are formed at the microcomputer as, for example, shown on the right side of FIG. 6. These signals DATA, CK and ENBL are then provided to the switching circuit 51 via terminals T22 to T25.

Further, because of the transmission of the command signal CMND, a control signal MDPL of, for example, a level "0" is formed in the microcomputer, and the signal MDLP is provided to the switching circuit 51 as a control signal thereof via terminal 22.

In this way, in the case of transmitting the command signal CMND, the signals DATA, CK and ENBL provided to the switching circuit 51 are provided to the converter circuit 53.

Then, at the converter circuit 53, the data signal DATA for the command signal CMND is converted to a digital MSK signal for every one bit thereof. The digital MSK signal is then provided to the D/A converter circuit 54 and converted to an analog MSK signal, which is provided to the switch circuit 55.

At this time, a control signal S55 to be described later is provided to the switch circuit 55 and in transmitting the command signal CMND, the switch circuit 55 is operated to connect the D/A converter 54 to the VCO 431 in the PLL circuit 43 for providing the MSK signal from the D/A converter 54 to the VCO 431 as a modulation signal.

The FM signal St FM modulated by the MSK signal is then taken from the VCO 431 and this FM signal St is transmitted to the base unit.

When the command signal CMND transmitted from the base unit is received, the MSK signal thereof is outputted from the FM demodulation circuit 18. The MSK signal is then provided to a waveform shaping circuit 29 and shaped into a rectangular wave MSK signal, which is then provided to the microcomputer for system control via terminal T21.

The microcomputer then discriminates the difference in the pulse width of the MSK signal to demodulate the command signal CMND and executes the process in accordance with this command signal CMND.

Specific Example of Switching Circuit

Figure 7:
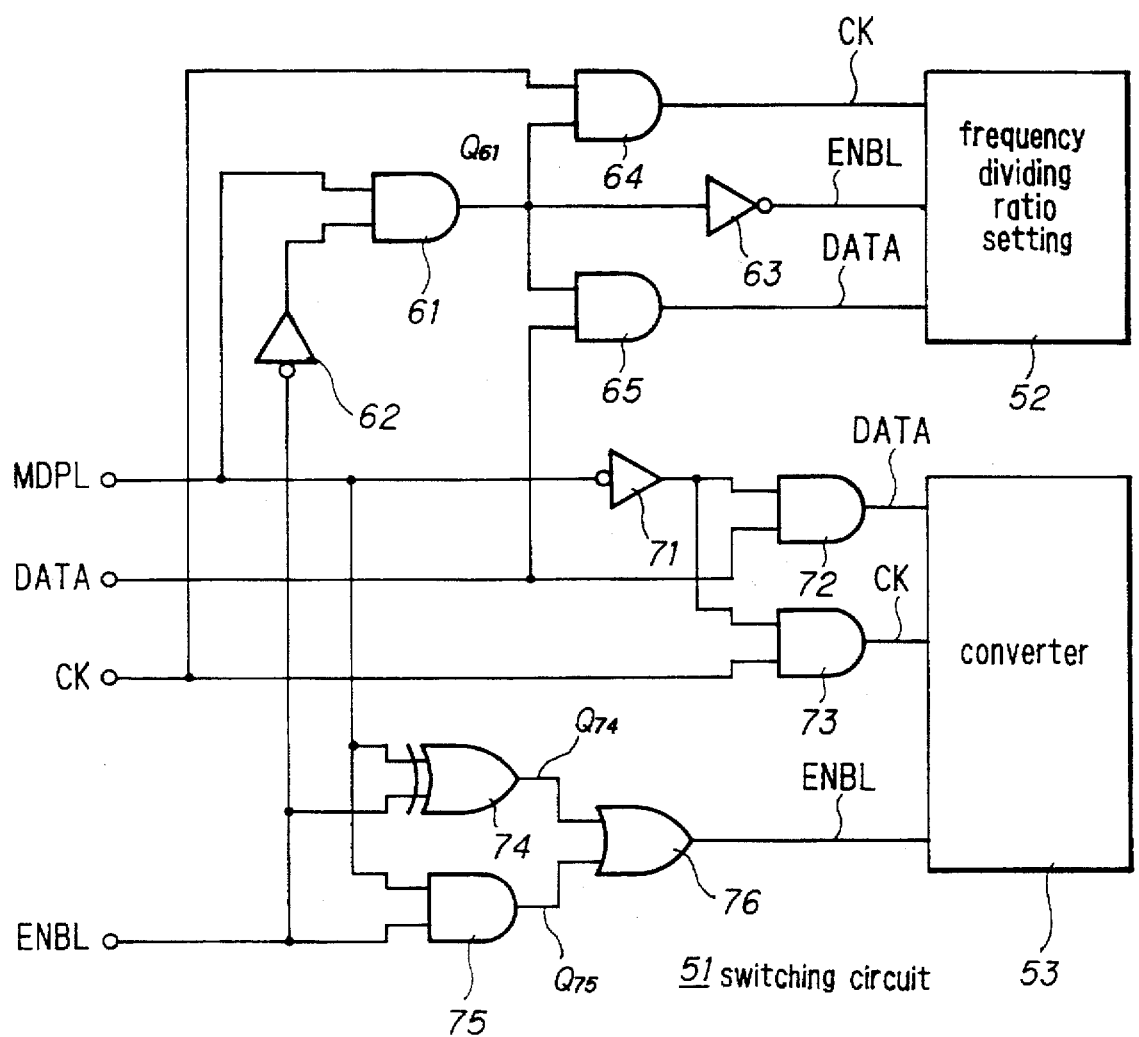
FIG. 7 is a system diagram showing a part of an example of the switching circuit according to the present invention.

FIG. 7 shows a specific example of the switching circuit 51. The signal MDPL is provided to an AND circuit 61, with the signal ENBL being provided via an inverter 62. Therefore, when the signal MDPL is MDPL="1" (when setting the frequency dividing ratios N31 and N43) the output Q61 of the AND circuit 61 is Q61="1" when the signal ENBL is ENBL="0", and Q61="0" when the signal ENBL is ENBL="1".

Because the signal Q61 is provided to the inverter 63, the signal ENBL is provided from the inverter 63 only when the signal MDPL is MDPL="1". The signal ENBL from the inverter 63 is then provided to the frequency dividing ratio setting circuit 52.

The signals CK and DATA are provided to the AND circuits 64 and 65, as is the signal Q61. The signals CK and DATA are therefore only provided from the AND circuits 64 and 65 when the signal MDPL is MDPL="1".

The signals CK and DATA from the AND circuits 64 and 65 are then provided to the frequency dividing ratio setting circuit 52.

When the signal MDPL is MDPL="1", the signals DATA, CK and ENBL are provided to the frequency dividing ratio setting circuit 52, as shown on the left side of FIG. 4.

In this case, the signals DATA and CK are provided to the AND circuits 72 and 73, but the signal MDPL is also provided to these AND circuits 72 and 73 via an inverter 71. Therefore, when the signal MDPL is MDPL="1", the signals DATA and CK are not outputted from the AND circuits 72 and 73 and are not provided to the converter circuit 53.

Further, the signal ENBL is provided to an exclusive OR circuit 74 and the AND circuit 75, but the signal MDPL is also provided to the exclusive OR circuit 74 and the AND circuit 75. Therefore, if the signal ENBL is ENBL="1", the output Q75 of the AND circuit 75 becomes "1" and this signal Q75 (="1") is provided to the converter circuit 53 as the signal ENBL via an OR circuit 76.

Moreover, if the signal ENBL is ENBL="0", the output Q74 of the exclusive or circuit 74 becomes "1" and this signal Q74 (="1") is provided to the converter circuit 53 as the signal ENBL via the OR circuit 76.

Therefore, when the signal MDPL is MDPL="1", the signals DATA and CK are not provided to the converter circuit 53 and the signal ENBL provided to the converter circuit 53 is always "1".

On the other hand, when the signal MDPL is MDPL="0" (when forming the signal MSK), the output Q61 of the AND circuit 61 is Q61="0" regardless of the signal ENBL and this signal Q61 is provided to the inverter 63. The signal ENBL from the inverter 63 therefore becomes ENBL="1" and is provided to the frequency dividing ratio setting circuit 52. The signals CK and DATA are prevented by the AND circuits 64 and 65 and are not provided to the frequency dividing ratio setting circuit 52, because the signal Q61 is Q61="0".

In this way, the signals DATA, CK and ENBL are not provided to the frequency dividing ratio setting circuit 52 when the signal MDPL is MDPL="0".

In this case, however, the signal MDPL is MDPL="1", so that the signals DATA and CK are provided to the converter circuit 53 via the AND circuits 72 and 73. Further, if the signal ENBL is ENBL="1", then Q74 becomes Q74="1" and is provided to the converter circuit 53 as the signal ENBL via the OR circuit 76.

Further, if the signal ENBL is ENBL="0", then Q74 and Q75 become "0" and are provided to the converter circuit 53 as the signal ENBL via the OR circuit 76.

Therefore, when the signal MDPL is MDPL="0", the signals DATA, CK and ENBL are provided to the converter circuit 53.

As is apparent from FIG. 4, the output signal of the OR circuit 76 only becomes "0" while the data DATA is being provided to the converter circuit 53. This output signal may therefore be used as the control signal S55 for the switch circuit 55.

According to this switching circuit 51, the signals DATA, CK and ENBL are selectively provided to the frequency dividing ratio setting circuit 52 and the converter circuit 53 in accordance with the signal MDPL. Therefore, when the data DATA is being provided to one of either the frequency dividing ratio setting circuit 52 or the converter circuit 53, the mixing in of the data DATA as low frequency noise or the mixing in of the clock CK and its higher harmonics as high frequency noise at the other circuit can be reduced.

The signal ENBL provided to the converter circuit 53 is expressed as,

ENBL=(MDPL*ENBL)+(MDPL·ENBL)

where
*: "EXCLUSIVE OR"
+: "OR" and
·: "AND".

This means that no problems occur even if the logic conditions (states) are different when the converter circuit 53 is out of access.

That is, when switching to the converter circuit 53 is carried out using only the output signal of the AND circuit for the signal MDPL and the signal ENBL, the converter circuit 53 may or may not go into the enable state at the instant of the switching, but the switching to the converter circuit 53 in the switching circuit 51 is carried out in accordance with the above equation, so that the signal ENBL provided to the converter circuit 53 from the OR circuit 76 can be fixed at "1" when the converter circuit 53 is not selected. Therefore, the converter circuit 53 will not become unstable.

The case has been described in the above is the application of the present invention to a cordless telephone. However, the present invention is applicable to any situation in which data is transmitted and received using a transmitter/receiver employing a duplex method.

According to the present invention, the data, clock and enable signals may be selectively provided to a circuit for setting frequency dividing ratio and a circuit for transmitting data.

The number of terminals may therefore be reduced when the circuit is integrated, so that the IC package may be made more compact, the surface mounting area may be reduced, and the equipment may be effectively made smaller.

Further, when a data signal is being provided to either the circuit for setting frequency dividing ratio or the circuit for transmitting data, the interference of the provided data signal with the other circuit as noise may therefore be reduced.

What is claimed is:

1. An integrated circuit comprising
   frequency dividing ratio setting means for setting a transmission frequency dividing ratio and a receiving frequency dividing ratio based on externally provided data;
   first variable frequency dividing means for producing a signal transmitting frequency in accordance with said transmission frequency dividing ratio set by said frequency dividing ratio setting means;
   second variable frequency dividing means for producing a signal receiving frequency in accordance with said receiving frequency dividing ratio set by said frequency dividing ratio setting means;
   data converting means for converting said externally-provided data to a signal for transmission; and
   switching means for selectively providing said externally-provided data to one of said frequency dividing ratio setting means and said data converting means in response to an externally-provided control signal.

2. An integrated circuit according to claim 1, wherein said first and second variable frequency dividing means include a phase-locked loop.

3. A transmitter/receiver including an integrated circuit, said integrated circuit comprising:
   frequency dividing ratio setting means for setting a transmission frequency dividing ratio and a receiving frequency dividing ratio based on externally-provided data;
   first variable frequency dividing means for producing a signal transmitting frequency in accordance with said transmission frequency dividing ratio set by said frequency dividing ratio setting means;
   second variable frequency dividing means for producing a signal receiving frequency in accordance with said receiving frequency dividing ratio set by said frequency dividing setting means;
   data converting means for converting said externally-provided data to a signal for transmission; and
   switching means for selectively providing said externally-provided data to one of said frequency dividing ratio setting means and said data converting means in response to an externally-provided control signal.

4. A transmitter/receiver according to claim 3, wherein said first and second variable frequency dividing means include a phase-locked loop.

* * * * *